US009721994B2

(12) United States Patent
Miyazaki et al.

(10) Patent No.: US 9,721,994 B2
(45) Date of Patent: Aug. 1, 2017

(54) SEMICONDUCTOR DEVICE AND IMAGING DEVICE FOR READING CHARGE

(71) Applicant: Kabushiki Kaisha Toshiba, Minato-ku (JP)

(72) Inventors: Takashi Miyazaki, Ota (JP); Hideyuki Funaki, Shinagawa (JP); Yoshinori Iida, Kita (JP); Isao Takasu, Setagaya (JP); Yuki Nobusa, Fuchu (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/943,221

(22) Filed: Nov. 17, 2015

(65) Prior Publication Data

US 2016/0268345 A1 Sep. 15, 2016

(30) Foreign Application Priority Data

Mar. 10, 2015 (JP) .................. 2015-047489

(51) Int. Cl.
*H01L 27/30* (2006.01)
*H01L 27/146* (2006.01)
*H01L 51/42* (2006.01)

(52) U.S. Cl.
CPC ........ *H01L 27/307* (2013.01); *H01L 27/1461* (2013.01); *H01L 27/1464* (2013.01);
(Continued)

(58) Field of Classification Search
CPC ............................ H01L 27/307; H01L 51/424
See application file for complete search history.

(56) References Cited

U.S. PATENT DOCUMENTS 5,367,188 A * 11/1994 Kudo ................ H01L 27/14643
257/461
2009/0188547 A1* 7/2009 Hayashi ................ B82Y 10/00
136/249

(Continued)

FOREIGN PATENT DOCUMENTS

| JP | 2010-045318 | 2/2010 |
|---|---|---|
| JP | 2011-138927 | 7/2011 |
| JP | 2013-135123 | 7/2013 |

*Primary Examiner* — Peter Bradford
(74) *Attorney, Agent, or Firm* — Oblon, McClelland, Maier & Neustadt, L.L.P.

(57) ABSTRACT

According to an embodiment, a semiconductor device includes a silicon substrate, a photoelectric conversion layer, a termination layer, and an electrode layer. In the silicon substrate, first semiconductor regions and second semiconductor regions are alternately arranged along a first surface on a light incident side of the silicon substrate. The first semiconductor regions are doped with impurities of first concentration and have a conductivity of either one of p-type and n-type. The second semiconductor regions are doped with impurities of a second concentration lower than the first concentration and have a conductivity of the other type. The photoelectric conversion layer is disposed on a first surface side of the silicon substrate. The termination layer is disposed between the silicon substrate and the photoelectric conversion layer, in contact with the first surface, and to terminate dangling bonds of the silicon substrate. The electrode layer is provided on the light incident side.

11 Claims, 11 Drawing Sheets

(52) U.S. Cl.
CPC .. *H01L 27/14645* (2013.01); *H01L 27/14667* (2013.01); *H01L 27/14694* (2013.01); *H01L 51/424* (2013.01); *Y02E 10/549* (2013.01)

(56) References Cited

U.S. PATENT DOCUMENTS

| | | | |
|---|---|---|---|
| 2011/0019042 A1* | 1/2011 | Yamaguchi | H01L 27/14632 348/280 |
| 2011/0074491 A1* | 3/2011 | Yofu | B82Y 10/00 327/514 |
| 2011/0156104 A1 | 6/2011 | Yamaguchi | |
| 2011/0227091 A1* | 9/2011 | Toda | H01L 27/1463 257/76 |
| 2013/0341491 A1 | 12/2013 | Hirose et al. | |
| 2014/0103477 A1 | 4/2014 | Toda | |
| 2015/0255498 A1* | 9/2015 | Sugiura | H01L 27/14621 257/432 |
| 2016/0268220 A1* | 9/2016 | Tsai | H01L 27/14643 |

\* cited by examiner

… (1) …

SEMICONDUCTOR DEVICE AND IMAGING DEVICE FOR READING CHARGE

CROSS-REFERENCE TO RELATED APPLICATIONS

This application is based upon and claims the benefit of priority from Japanese Patent Application No. 2015-047489, filed on Mar. 10, 2015; the entire contents of which are incorporated herein by reference.

FIELD

Embodiments described herein relate generally to a semiconductor device and an imaging device.

BACKGROUND

Semiconductor devices have been known that read charges photoelectrically converted by photoelectric conversion films. For example, a structure of such semiconductor devices has been known in which electrode layers are disposed so as to sandwich a photoelectric conversion film and a silicon substrate including p-type semiconductor regions and n-type semiconductor regions is in an ohmic contact with one of the electrode layers. Moreover, a technique is disclosed in which a photoelectric conversion film is connected to a floating diffusion region via a semiconductor region and a transfer transistor.

Signals read from the semiconductor device include noise due to capacitance of the floating diffusion region in some cases. To eliminate noise, a technique is disclosed that uses a photoelectric conversion film formed of a silicon substrate and having a photoelectric conversion function and a charge accumulation function, and employs a noise elimination technique called correlated double sampling (CDS).

The conventional technique, however, cannot eliminate noise included in the read signals in some cases.

DETAILED DESCRIPTION

According to an embodiment, a semiconductor device includes a silicon substrate, a photoelectric conversion layer, a termination layer, and an electrode layer. In the silicon substrate, first semiconductor regions and second semiconductor regions are alternately and continuously arranged along a first surface on a light incident side of the silicon substrate. The first semiconductor regions are doped with impurities of a first concentration and have a conductivity of either one of a p-type and an n-type. The second semiconductor regions are doped with impurities of a second concentration lower than the first concentration and have a conductivity of the other type. The photoelectric conversion layer is disposed on a first surface side of the silicon substrate. The termination layer is disposed between the silicon substrate and the photoelectric conversion layer, in contact with the first surface of the silicon substrate, and to terminate dangling bonds of the silicon substrate. The electrode layer is provided on the light incident side of the photoelectric conversion layer.

Various embodiments will be described in detail with reference to the accompanying drawings.

First Embodiment

Figure 1:
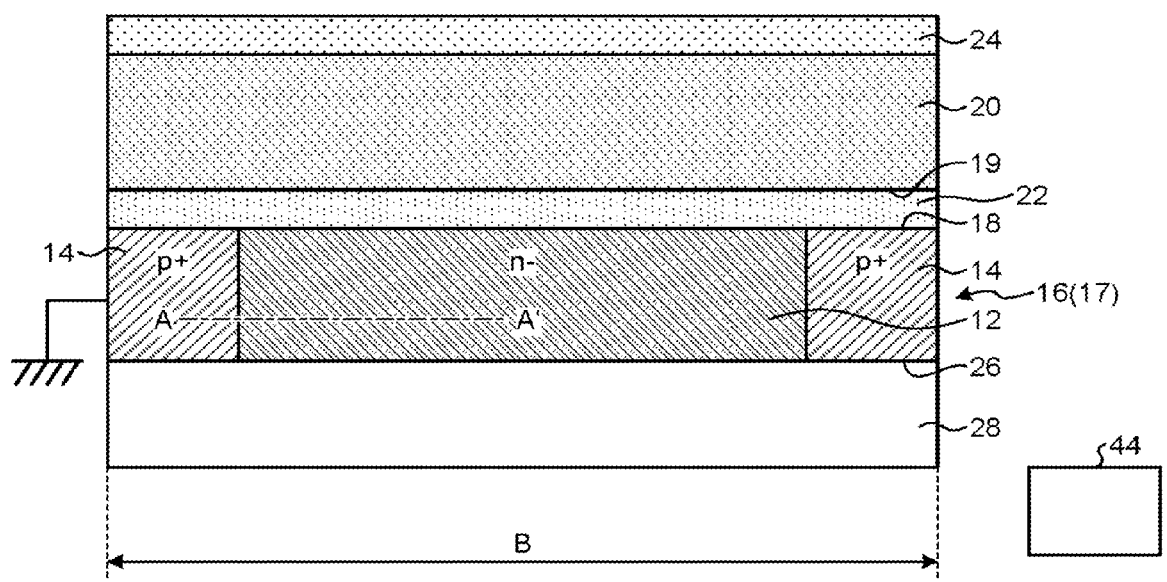
FIG. 1 is a schematic diagram illustrating an example of a semiconductor device.

FIG. 1 is a schematic diagram illustrating an example of a semiconductor device 10 according to a first embodiment. The semiconductor device 10 is applicable to an imaging device 100 that images an object and obtains the image data of the object, for example.

The semiconductor device 10 includes a silicon substrate 16, a photoelectric conversion layer 20, a termination layer 22, an electrode layer 24, a reading circuit 28, a voltage application unit 44.

The semiconductor device 10 has a stacked structure composed of the reading circuit 28, the silicon substrate 16, the termination layer 22, the photoelectric conversion layer 20, and the electrode layer 24 that are stacked in this order. The semiconductor device 10 in the first embodiment receives light entering from an electrode layer 24 side toward a silicon substrate 16 side, and performs photoelectric conversion by the photoelectric conversion layer 20. The semiconductor device 10 reads, by the reading circuit 28, a signal according to the charges converted by the photoelectric conversion layer 20.

The semiconductor device 10 according to the first embodiment is thus a stacked-type image sensor in which the photoelectric conversion layer 20 and the electrode layer 24 are stacked on a backside-irradiation-type complementary metal oxide semiconductor (CMOS) image sensor. The backside irradiation-type image sensor means the structure in which the reading circuit 28 is provided on the side opposite a light incident side of the silicon substrate 16.

The silicon substrate 16 includes second semiconductor regions 12 and first semiconductor regions 14 that are alternately arranged along a first surface 18 of the silicon substrate 16. The first surface 18 is the surface of the silicon substrate 16 on the light incident side of the semiconductor device 10. In other words, the first surface 18 is the surface on a photoelectric conversion layer 20 side of the silicon substrate 16.

The first semiconductor regions 14 are semiconductor regions doped with impurities of a first concentration. The first semiconductor regions 14 have a conductivity of either one of a p-type and an n-type. The second semiconductor regions 12 are semiconductor regions doped with impurities of a second concentration lower than the first concentration. The second semiconductor regions 12 have a conductivity of the other type.

For example, in the case where charges produced by the photoelectric conversion by the photoelectric conversion layer 20 are electrons, the second semiconductor regions 12 are n− (n minus) type semiconductor regions while the first semiconductor regions 14 are p+ (p plus) type semiconductor regions. In contrast, in the case where charges produced by the photoelectric conversion by the photoelectric conversion layer 20 are holes, the second semiconductor regions 12 are the p− type semiconductor regions while the first semiconductor regions 14 are the n− type semiconductor region.

The first semiconductor regions 14 are connected to the ground. A relative electric potential difference between the first semiconductor region 14 and the second semiconductor region 12 is thus fixed.

In the case where the first semiconductor regions 14 are the p+ type and the second semiconductor regions 12 are the n− type, the electric potential of the first semiconductor regions 14 is lower than that of the second semiconductor regions 12. The first semiconductor regions 14, thus, function as potential barriers for electrons in the second semiconductor regions 12.

Similarly, in the case where the first semiconductor regions 14 are n+ (n plus) type and the second semiconductor regions 12 are p− (p minus) type, the electric potential of the first semiconductor regions 14 is higher than that of the second semiconductor regions 12. In this case, the first semiconductor regions 14 function as potential barriers for holes in the second semiconductor regions 12.

Herein, the region including the second semiconductor region 12 and a part of the first semiconductor regions 14 adjacent to the second semiconductor region 12 is defined as a pixel region B as illustrated in FIG. 1.

The first semiconductor regions 14 function as the potential barriers, as described above. The first semiconductor regions 14 thus function as pixel separation regions that prevent the electrons from the second semiconductor region 12 from mixing into the adjacent pixel regions B. The second semiconductor region 12 functions as a charge accumulation region that accumulates charges converted by the photoelectric conversion layer 20.

In the following description, charges are electrons unless otherwise noted. Furthermore, in the following description, the second semiconductor regions 12 are the n−type while the first semiconductor regions 14 are the p+ type.

In the semiconductor device 10 in the first embodiment, charges may be holes and the second semiconductor regions 12 may be the p− type while the first semiconductor regions 14 may be the n+ type.

The first semiconductor regions 14 are the semiconductor regions doped with the impurities of the first concentration, as described above. The second semiconductor regions 12 are the semiconductor regions doped with the impurities of the second concentration lower than the first concentration, as described above.

The first concentration is higher than the second concentration. Specifically, the first concentration is preferably in a range from $1.0 \times 10^{14}$ cm$^{-3}$ to $1.0 \times 10^{17}$ cm$^{-3}$, and more preferably in a range from $1.3 \times 10^{14}$ cm$^{-3}$ to $3.6 \times 10^{16}$ cm$^{-3}$.

The first semiconductor regions 14 and the second semiconductor regions 12 are formed by doping impurities into a silicon layer 17 (refer to FIG. 2, which is described in detail later). The concentrations of impurities to be doped are adjusted to the respective first and the second concentrations. As a result, the first semiconductor regions 14 and the second semiconductor regions 12 are formed.

A first density of the impurities in the first semiconductor region 14 and a second density of the impurities in the second semiconductor region 12 preferably satisfy the following expression (1).

$$N_a > N_d \times A_d / A_d \qquad (1)$$

where $N_a$ represents the first density of the impurities in the first semiconductor regions 14, $N_d$ represents the second density of the impurities in the second semiconductor region 12, $A_a$ represents an area of the first semiconductor region 14 in the pixel region B, and $A_d$ represents an area of the second semiconductor regions 12 in the pixel region B. Typically, $A_a$ is smaller than $A_d$ ($A_a < A_d$).

The area of the first semiconductor region 14 and the area of the second semiconductor regions 12 in the pixel region B correspond to the area of the first semiconductor region 14 and the area of the second semiconductor regions 12 in a cross-section in parallel with the first surface 18 in the pixel region B of the silicon substrate 16, respectively. The direction in parallel with the first surface 18 is the direction perpendicular to the stacking direction of the silicon substrate 16, the termination layer 22, the photoelectric conversion layer 20, and the electrode layer 24 in the semiconductor device 10.

As a result of the relation between the first density of the impurities in the first semiconductor region 14 and the second density of the impurities in the second semiconductor region 12 satisfying the expression (1), the second semiconductor region 12 can be completely depleted.

The first density $N_a$ of the impurities in the first semiconductor region 14 is in a range from $1 \times 10^{17}$ cm$^{-3}$ to $1 \times 10^{18}$ cm$^{-3}$, for example. The second density $N_d$ of the impurities in the second semiconductor region 12 is in a range from $1 \times 10^{16}$ cm$^{-3}$ to $1 \times 10^{17}$ cm$^{-3}$, for example. The values of the first density $N_a$ and the second density $N_d$ are not limited to those values in the ranges.

The thicknesses of the second semiconductor region 12 and the first semiconductor region 14 are not limited to specific values. The thickness of the second semiconductor region 12 and the first semiconductor region 14 is 5 μm, for example.

The reading circuit 28 is provided on a second surface 26 side of the silicon substrate 16. The second surface 26 is opposite the first surface 18 located on the light incident side of the silicon substrate 16. The reading circuit 28 reads charges accumulated in the second semiconductor regions 12 as a signal. The details of the reading circuit 28 will be described later.

The following describes the photoelectric conversion layer 20. The photoelectric conversion layer 20 is disposed on the first surface 18 side of the silicon substrate 16.

The photoelectric conversion layer 20 converts light entering the photoelectric conversion layer 20 through the electrode layer 24 into charges. The photoelectric conversion layer 20 includes, as a principal component, an inorganic material such as amorphous silicon that performs photoelectric conversion over the whole visible light range, a compound such as copper indium gallium diselenide (CIGS), or an organic material. The principal component means that the content thereof is equal to or larger than 70%. For the photoelectric conversion layer 20, a panchromatic organic photoelectric conversion film may be used.

The material used for the photoelectric conversion layer 20 is not limited to any specific material. When light in a different wavelength range from that converted by the photoelectric conversion layer 20 is further photoelectrically converted on the silicon substrate 16 side of the photoelectric conversion layer 20, the photoelectric conversion layer 20 needs to have a wavelength selectivity. The photoelectric conversion layer 20 having the wavelength selectivity allows light having a wavelength other than the target wavelength range of the photoelectric conversion of the photoelectric conversion layer 20 to pass through the photoelectric conversion layer 20. In this case, the photoelectric conversion layer 20 includes quinacridone or subphthalocyanine, for example.

The photoelectric conversion layer 20 preferably includes an organic material as the principal component.

The use of the photoelectric conversion layer 20 including an organic material as the principal component makes it possible to further increase a resistivity of the photoelectric conversion layer 20 than that of the photoelectric conversion layer 20 including no organic material as the principal component. The higher the resistivity of the photoelectric conversion layer 20 is, the further charges produced in the photoelectric conversion layer 20 can be prevented from spreading to the regions corresponding to the other pixel regions B in the photoelectric conversion layer 20. In other words, charges from the other pixel regions B can be prevented from mixing into the respective pixel regions B.

The region corresponding to each pixel region B in the photoelectric conversion layer 20 is the region adjacent to each pixel region B in a thickness direction in the photoelectric conversion layer 20 with the termination layer 22 interposed therebetween. The thickness direction is the direction along the thickness of the semiconductor device 10 and the same direction as the stacking direction of the silicon substrate 16, the termination layer 22, and the photoelectric conversion layer 20.

The use of the photoelectric conversion layer 20 including an organic material as the principal component can also achieve the following effects. When the photoelectric conversion layer 20 including an organic material as the principal component is stacked on the silicon substrate 16 without interposing an electrode layer (lower electrode layer) therebetween, no fine processing is required for forming the lower electrode layer. Furthermore, the pixel region B including the second semiconductor region 12 and the first semiconductor regions 14 can be readily formed by adjusting the concentrations of the impurities doped into the silicon layer 17.

In the semiconductor device 10 in the first embodiment, the photoelectric conversion layer 20 is a continuous film continuously provided along the arrangement direction of the second semiconductor regions 12 that function as the charge accumulation region. The photoelectric conversion layer 20 is thus continuously provided over the multiple pixel regions B.

The electrode layer 24 is provided on the light incident side of the photoelectric conversion layer 20. The electrode layer 24 may be made of a material that transmits light having a wavelength range that is the detection target by the semiconductor device 10 and that has conductivity. The electrode layer 24 is made of a material such as indium tin oxide (ITO), graphene, or zinc oxide (ZnO).

The thickness of the electrode layer 24 is not limited to any specific thickness. The thickness of the electrode layer 24 is 35 nm, for example.

The termination layer 22 is disposed between the silicon substrate 16 and the photoelectric conversion layer 20. The termination layer 22 is disposed in contact with at least the first surface 18 of the silicon substrate 16. The termination layer 22 may be disposed in such a manner that another layer is interposed between the termination layer 22 and the photoelectric conversion layer 20. In other words, the termination layer 22 may be disposed without being in contact with the photoelectric conversion layer 20.

The termination layer 22 is preferably disposed in contact with both of the silicon substrate 16 and the photoelectric conversion layer 20. Specifically, the termination layer 22 is preferably disposed in contact with both of the first surface 18 of the silicon substrate 16 and a third surface 19 of the photoelectric conversion layer 20. The third surface 19 is a surface of the photoelectric conversion layer 20 on a side adjacent to the silicon substrate 16.

The termination layer 22 terminates surface dangling bonds of the silicon substrate 16.

Here, the photoelectric conversion layer 20 is assumed to be stacked on un-terminated dangling bonds on the surface of the silicon substrate 16. When the photoelectric conversion layer 20 is stacked on the un-terminated dangling bonds on the surface of the silicon substrate 16, an interface level is formed in an interface between the silicon substrate 16 and the photoelectric conversion layer 20. The interface level acts as a trap of charges converted by the photoelectric conversion layer 20.

The interface level acting as a trap causes noise and an afterimage to occur in a signal read by the reading circuit 28. The interface level acting as a trap causes band bending to occur in the interface between the silicon substrate 16 and the photoelectric conversion layer 20, thereby hindering complete transfer of charges from the photoelectric conversion layer 20 to the silicon substrate 16.

To address such situations, the semiconductor device 10 in the embodiment includes the termination layer 22 disposed between the first surface 18 and the photoelectric conversion layer 20. The termination layer 22 terminates the dangling bonds on the surface of the silicon substrate 16.

The termination layer 22 may be a layer having a function to terminate the surface dangling bonds of the silicon substrate 16. The termination layer 22 is a silicon dioxide film, for example.

The termination layer 22 may be a region where all of the dangling bonds on the surface of the silicon layer 17 are terminated by hydrogen, for example. FIG. 2 is an explanatory view of the termination layer 22.

Figure 2:
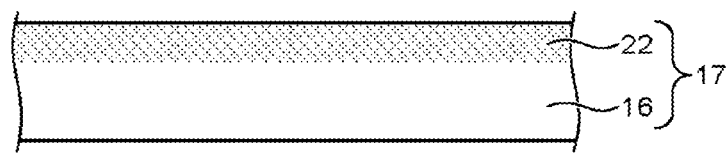
FIG. 2 is an explanatory view of a termination layer.

The silicon layer 17 illustrated in FIG. 2 is prepared. The silicon layer 17 is an un-terminated layer in the silicon substrate 16. The silicon layer 17 includes the first semiconductor regions 14 and the second semiconductor regions 12 that are alternately and continuously arranged on the surface thereof. The dangling bonds on the surface of the silicon layer 17 are terminated by hydrogen by treating the surface with hydrofluoric acid, for example.

In this case, the termination layer 22 is a region where the surface dangling bonds are terminated with hydrogen in the silicon layer 17. In this case, the termination layer 22 is a Si—H layer where the dangling bonds on the surface of the silicon layer 17 are terminated with hydrogen atoms. In this case, the silicon substrate 16 is the region that continues on the second surface 26 side of the termination layer 22 in the silicon layer 17.

The termination layer 22 may have a thickness that allows charges produced in the photoelectric conversion layer 20 to pass through the termination layer 22 to the silicon substrate 16. For example, when the termination layer 22 is a silicon dioxide film, the thickness of the termination layer 22 is preferably equal to or smaller than 2 nm. The thickness of the termination layer 22 may be 1.5 nm, for example.

In the case where the termination layer 22 is a silicon dioxide film, a direct tunneling phenomenon occurs when an electric field intensity in the film is 1 to 2 MV/cm. The direct tunneling phenomenon means that substantially 100% of charges that drift from the photoelectric conversion layer 20 toward the silicon substrate 16 pass through the termination layer 22 to the silicon substrate 16. From this point of view, the thickness of the termination layer 22 is preferably equal to or smaller than 2 nm when the termination layer 22 is a silicon dioxide film.

Referring back to FIG. 1, the following describes a flow of charges in the semiconductor device 10 in the embodiment.

When light traveling from the electrode layer 24 side to the photoelectric conversion layer 20 enters the semiconductor device 10 thus structured, the photoelectric conversion layer 20 converts incident light into charges.

The charges produced by the photoelectric conversion layer 20 are drifted by an electric field formed in the thickness direction of the semiconductor device 10 in the photoelectric conversion layer 20 toward the silicon substrate 16, and reach the termination layer 22. The thickness direction of the semiconductor device 10 is the same direction as the stacking direction of the respective layers included in the semiconductor device 10.

When the photoelectric conversion layer 20 includes an organic material as the principal component, charges produced by the photoelectric conversion layer 20 are prevented from moving in the direction intersecting with the stacking direction and drifting toward the other pixel regions B, as described above.

When the termination layer 22 is not provided, the produced charges are trapped by the interface level formed in the interface between the silicon substrate 16 and the photoelectric conversion layer 20, thereby causing noise, as described above. The semiconductor device 10 in the embodiment, however, includes the termination layer 22 provided between the silicon substrate 16 and the photoelectric conversion layer 20.

As a result, charges that drift in the photoelectric conversion layer 20 toward the silicon substrate 16 and that reach the third surface 19 of the photoelectric conversion layer 20 completely (substantially 100%) pass through the termination layer 22 to the silicon substrate 16.

The first semiconductor region 14 in the silicon substrate 16 functions as the potential barrier for charges reaching the second semiconductor region 12, as described above. As a result, an electric field that causes charges to drift from the first semiconductor region 14 toward the second semiconductor region 12 is formed between the second semiconductor region 12 and the first semiconductor region 14. The charges having reached the silicon substrate 16 from the photoelectric conversion layer 20 through the termination layer 22 are collected in the second semiconductor region 12 for each pixel region B by the electric field directing from the first semiconductor region 14 toward the second semiconductor region 12.

The second semiconductor region 12 has been depleted. The charges produced by the photoelectric conversion layer 20 are thus accumulated in the second semiconductor region 12 without being mixed with charges already accumulated in the silicon substrate 16. The charges accumulated in the second semiconductor region 12 are read by the reading circuit 28 as a signal.

When the first semiconductor region 14 is not completely depleted, a region near the central region in the direction perpendicular to the thickness direction in the first semiconductor region 14 becomes a flat band where no electric field is formed. As a result, charges that reach this region of the silicon substrate 16 from the photoelectric conversion layer 20 through the termination layer 22 are instantaneously recombined with the charges (holes or electrons) that are majority carriers in the first semiconductor region 14, thereby drifting to the second semiconductor region 12 side. Consequently, charges are prevented from remaining in the first semiconductor region 14 for a long time, thereby also preventing the occurrence of an afterimage.

When the semiconductor device 10 converts light into charges, the voltage application unit 44 applies a voltage to the electrode layer 24.

The voltage applied by the voltage application unit 44 to the electrode layer 24 may have a value equal to or larger than a voltage value necessary to allow charges to pass through the termination layer 22 by direct tunneling.

The specific value of the voltage applied by the voltage application unit 44 to the electrode layer 24 may be appropriately adjusted in accordance with the structure of the semiconductor device 10 so as to satisfy the condition described above.

For example, the size of the pixel region B is assumed to be 1 μm by 1 μm. The size of the pixel region B is the size of a surface in parallel with the first surface 18, which is a two-dimensional plane, in the pixel region B. The thickness of the silicon substrate 16 is assumed to be 5 μm. The width of the first semiconductor region 14 in the pixel region B is assumed to be 125 nm. The width of the first semiconductor region 14 in the pixel region B corresponds to half of the distance between the two adjacent second semiconductor regions 12. The size of the second semiconductor region 12 in the pixel region B is assumed to be 750 nm by 750 nm. The number of saturation electrons in the first semiconductor region 14 is assumed to be 100,000. The number of atoms of the impurities in the second semiconductor region 12 is equal to the number of saturation electrons.

In this case, the second density $N_d$ of the impurities in the second semiconductor region 12 is obtained by the following expression (2). The lower limit value ($N_{amin}$) of the first density Na of the impurities in the first semiconductor region 14 is obtained by the following expression (3).

$$N_d \text{ (cm}^{-3}\text{)}=100{,}000/(750 \text{ nm}\times 750 \text{ nm}\times 5 \text{ μm}) \qquad (2)$$

$$N_{amin}=100{,}000/[(1 \text{ μm}\times 1 \text{ μm}-750 \text{ nm}\times 750 \text{ nm})]\times 5 \text{ μm} \qquad (3)$$

When the first density of the impurities in the first semiconductor region 14 is equal to the value of $N_{amin}$ represented by the expression (3), then the flat band area in the first semiconductor region 14 disappears. When the relation represented by the expression (3) is satisfied, the first semiconductor region 14 is also completely depleted in the same manner as the second semiconductor region 12.

When both of the second semiconductor region 12 and the first semiconductor region 14 are completely depleted, all of the charges transferred from the photoelectric conversion layer 20 to the silicon substrate 16 through the termination layer 22 drift to the second semiconductor region 12 in any of the pixel regions B. Thus, all of the charges transferred from the photoelectric conversion layer 20 to the silicon substrate 16 are read by the reading circuit 28. When the expressions (2) and (3) are satisfied, an effective aperture ratio of the semiconductor device 10 used as an image sensor becomes the highest value.

The electric potential in the second semiconductor region 12 is represented by the following expression (A) when the first density $N_a$ of the impurities in the first semiconductor region 14 is $N_{amin}$. The expression (A) is obtained by linearly approximating an electric potential profile between the second semiconductor region 12 and the first semiconductor region 14 (refer to A-A' region in FIG. 1) and solving a Poisson equation.

$$V_{bi} = \frac{qN_a x_p^2}{2\varepsilon_{Si}\varepsilon_0} + \frac{qN_d x_p^2}{2\varepsilon_{Si}\varepsilon_0} \quad (A)$$

where $V_{bi}$ represents the electric potential in the second semiconductor region 12, $\varepsilon_{si}$ represents the permittivity of silicon, $\varepsilon_0$ represents the permittivity of vacuum, $X_p$ represents the distance (on the first semiconductor region 14 side) from the junction surface of the second semiconductor region 12 and the first semiconductor region 14, $X_n$ represents the distance (on the second semiconductor region 12 side) from the junction surface of the second semiconductor region 12 and the first semiconductor region 14, q represents the elementary electric charge, $N_a$ is the first density of the impurities in the first semiconductor region 14, and $N_d$ is the second density of the impurities in the second semiconductor region 12.

The electric potential of the central region in the direction perpendicular to the stacking direction in the second semiconductor region 12 can be estimated as 4.53 V from the expression (A). In this case, a relation between the electric potential of the applied voltage to the electrode layer 24 and the electric field intensity in the termination layer 22 is illustrated in FIG. 3.

Figure 3:
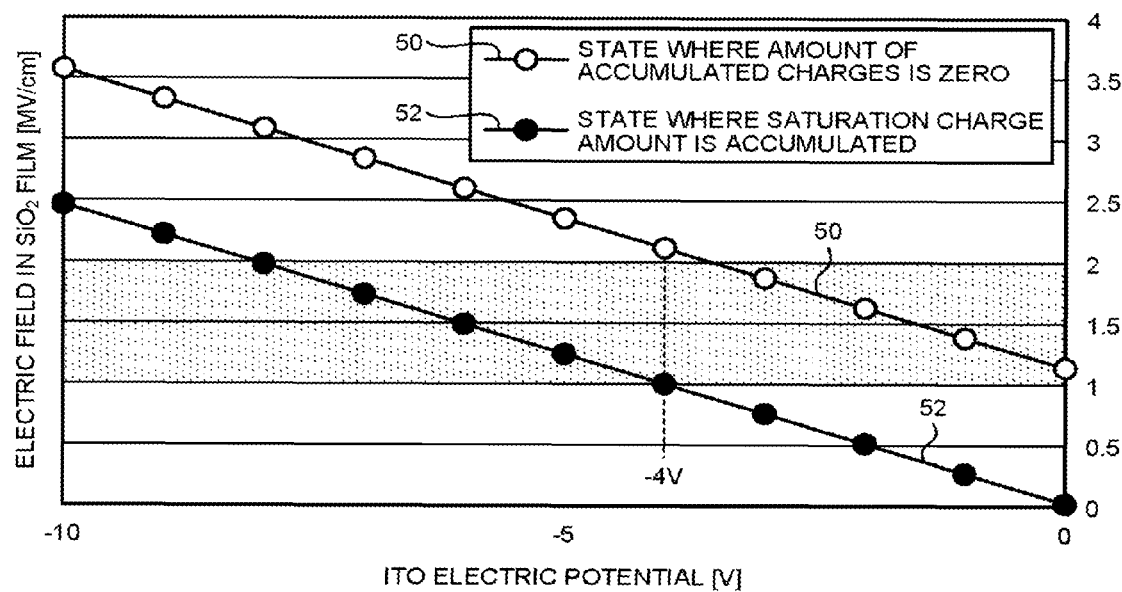
FIG. 3 is a schematic diagram illustrating a relation between an electronic potential and an electric field intensity.

FIG. 3 is a schematic diagram illustrating the relation between the electric potential of the applied voltage to the electrode layer 24 and the electric field intensity in the termination layer 22.

In the example illustrated in FIG. 3, an organic photoelectric conversion film having a thickness of 100 nm is used for the photoelectric conversion layer 20. A silicon dioxide film having a thickness of 1.5 nm is used for the termination layer 22. The calculation results of the electric field intensity in the termination layer 22 at an initial state (refer to line 50) and at accumulation of a saturation charge amount (refer to line 52) are illustrated in FIG. 3. At the initial state, an amount of accumulated charges in the second semiconductor region 12 is "zero". At the accumulation of a saturation charge amount, the difference in electric potential between the second semiconductor region 12 and the first semiconductor region 14 is 0 V.

As described above, in the case where the termination layer 22 is a silicon dioxide film, the direct tunneling phenomenon occurs when the electric field intensity in the film is 1 to 2 MV/cm. From the results illustrated in FIG. 3, when the first density of the impurities of the first semiconductor region 14 is $N_{amin}$, the second density of the impurities of the second semiconductor region 12 satisfies the expression (2), the organic photoelectric conversion film having a thickness of 100 nm is used for the photoelectric conversion layer 20, and the silicon dioxide film having a thickness of 1.5 nm is used for the termination layer 22, then the direct tunneling phenomenon occurs by applying a negative bias equal to or smaller than −4 V to the electrode layer 24.

Thus, in this case, the voltage application unit 44 may apply a negative bias equal to or smaller than −4 V to the electrode layer 24.

The following describes the reading circuit 28 in detail.

Figure 4:
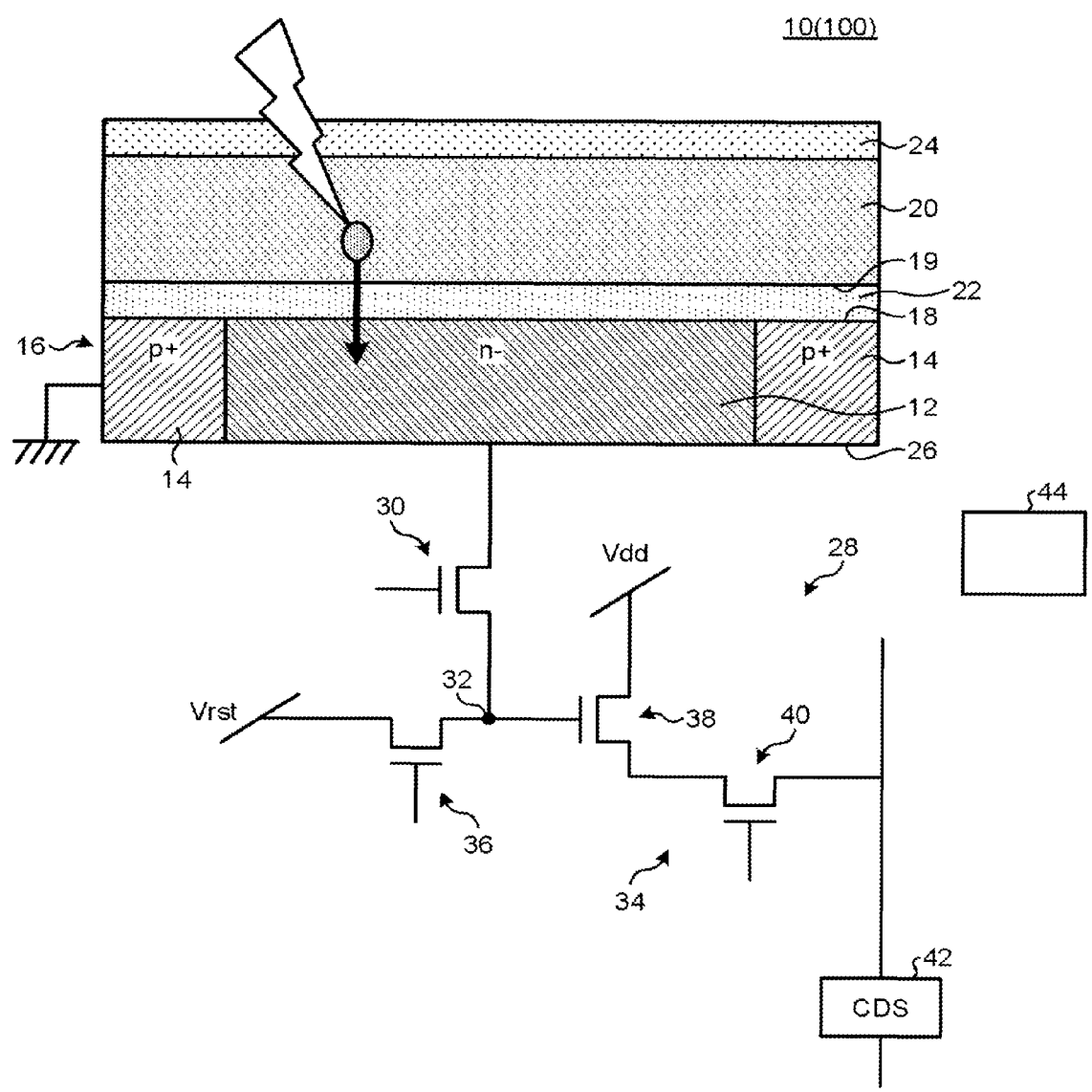
FIG. 4 is a schematic diagram illustrating the semiconductor device.

FIG. 4 is a schematic diagram illustrating the structure of the reading circuit 28 of the semiconductor device 10. The reading circuit 28 reads the charges accumulated in the second semiconductor region 12 as a signal.

The reading circuit 28 includes a transfer transistor 30, a third semiconductor region 32, and a wiring layer 34.

The transfer transistor 30, which is connected to the second semiconductor region 12, transfers the charges accumulated in the second semiconductor region 12 to the third semiconductor region 32.

The transfer transistor 30 may be a lateral transistor or a vertical transistor. The transfer transistor 30 is, however, preferably the vertical transistor. The use of the vertical transistor for the transfer transistor 30 makes it possible to form the pixel regions B in the semiconductor device 10 into finer regions. The application of the semiconductor device 10 thus structured to the imaging device 100 can achieve the imaging device 100 that provides high image quality.

The third semiconductor region 32, which is connected to the transfer transistor 30, converts the charges transferred from the transfer transistor 30 into a voltage. The third semiconductor region 32, which has a tiny capacitance, is called a floating diffusion. A conversion gain (gain for converting the charges into a voltage) of the third semiconductor region 32 is determined by the capacitance of the third semiconductor region 32. The higher the capacitance of the third semiconductor region 32 is, the higher the conversion gain is. The third semiconductor region 32 is connected to the wiring layer 34.

The wiring layer 34 outputs, as a signal, the voltage converted by the third semiconductor region 32. In the embodiment, the wiring layer 34 includes a reset transistor 36, an amplifier transistor 38, a selector transistor 40, and a correlated double sampling (CDS) 42. In the semiconductor device 10 in the embodiment, the reading circuit 28 includes four transistors (the transfer transistor 30, the reset transistor 36, the amplifier transistor 38, and the selector transistor 40).

The third semiconductor region 32 is connected to a gate of the amplifier transistor 38. The voltage converted by the third semiconductor region 32 is output from a source of the amplifier transistor 38 to the CDS 42 through the selector transistor 40.

The third semiconductor region 32 is connected to the source of the reset transistor 36. To a drain of the reset transistor 36, a power supply potential (Vrst), which is a reset level of the third semiconductor region 32, is connected.

The CDS 42 is a circuit that performs correlated double sampling. The CDS 42 eliminates noise by correlated double sampling from the signal that is output from the third semiconductor region 32 and transmitted through the amplifier transistor 38 and the selector transistor 40. The CDS 42 outputs the signal after the noise elimination as a signal read from the second semiconductor region 12.

Figure 5:
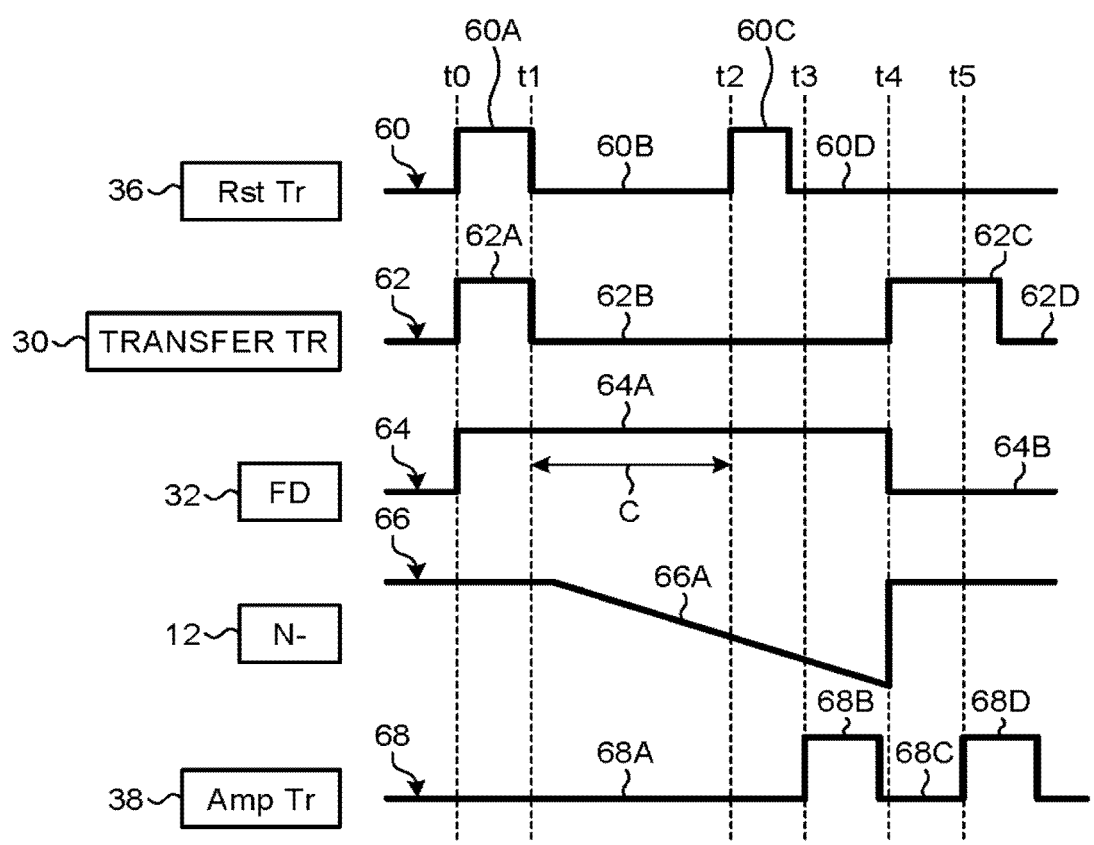
FIG. 5 is a timing chart illustrating reading of a signal.

FIG. 5 is an exemplary timing chart illustrating reading of a signal by the reading circuit 28. The control of the reading circuit 28 is performed by a controller, which is not illustrated.

In FIG. 5, line 60 illustrates on and off states of the reset transistor 36. Line 62 illustrates on and off states of the transfer transistor 30. Line 64 illustrates on and off states of the third semiconductor region 32. Line 66 illustrates the electric potential of the second semiconductor region 12 that accumulates charges. Line 68 illustrates on and off states of the amplifier transistor 38.

At timing t0, the transfer transistor 30 is turned on as denoted by 62A and the reset transistor 36 is turned on as denoted by 60A. As a result, reset operation is performed on the second semiconductor region 12 and the third semiconductor region 32. The reset operation causes the electric potential of the second semiconductor region 12 to be in the initial state. The reset operation is not mandatory. The reason is that charges are completely transferred from the second semiconductor region 12 to the third semiconductor region 32, in the embodiment.

At timing t1, the transfer transistor 30 is turned off as denoted by 62B. Likewise, the reset transistor 36 is turned off as denoted by 60B. As a result of the tuning off of the transfer transistor 30 as denoted by 62B, accumulation of charges in the second semiconductor region 12 starts (refer to an accumulation period C in FIG. 5). In the accumulation period, charges produced by the photoelectric conversion layer 20 reach the silicon substrate 16 through the termination layer 22 and are accumulated in the second semiconductor region 12. The electric potential of the second semiconductor region 12 thus reduces with an increase in accumulation of charges (electrons) (refer to line 66A in FIG. 5).

When this accumulation period ends, at timing t2, the reset transistor 36 is turned on as denoted by 60C while the transfer transistor 30 remains to be turned off as denoted by 62B. As a result, only the third semiconductor region 32 is reset. After the reset of the third semiconductor region 32 (refer to timing t3), the amplifier transistor 38 is turned on as denoted by 68B from the turned off state denoted by 68A. As a result, the amplifier transistor 38 reads the reset level of the third semiconductor region 32. After the reset level is read, the amplifier transistor 38 is turned off as denoted by 68C from the turned on state denoted by 68B. The reset level read by the amplifier transistor 38 is sampled and held by the CDS 42.

At timing t4, the transfer transistor 30 is turned on as denoted by 62C. As a result, the charges accumulated in the second semiconductor region 12 are completely transferred to the third semiconductor region 32. Thereafter, at timing t5, the amplifier transistor 38 is turned on as denoted by 68D from the turned off state as denoted by 68C. As a result, the CDS 42 reads a signal level. After the signal level is read, the amplifier transistor 38 is turned off.

The CDS 42 performs CDS processing on the read signal level using the reset level that is sampled and held, and reads the signal.

As described above, the semiconductor device 10 in the embodiment includes the silicon substrate 16, the photoelectric conversion layer 20, the termination layer 22, and the electrode layer 24. The silicon substrate 16 includes the second semiconductor regions 12 and the first semiconductor regions 14 that are alternately and continuously arranged along the first surface 18 on the light incident side. The first semiconductor regions 14 are doped with the impurities of the first concentration and have the conductivity of either one of the p-type and the n-type. The second semiconductor regions 12 are doped with the impurities of the second concentration lower than the first concentration and have the conductivity of the other type. The photoelectric conversion layer 20 is disposed on the first surface 18 side of the silicon substrate 16. The termination layer 22 is disposed between the silicon substrate 16 and the photoelectric conversion layer 20 in contact with the first surface 18 of the silicon substrate 16, and terminates the dangling bonds of the silicon substrate 16. The electrode layer 24 is provided on the light incident side of the photoelectric conversion layer 20.

The semiconductor device 10 in the embodiment includes the termination layer 22 that is disposed between the silicon substrate 16 and the photoelectric conversion layer 20 in contact with the first surface 18 of the silicon substrate 16, as described above. The termination layer 22 terminates the dangling bonds on the surface of the silicon substrate 16.

As a result, the charges that are photoelectrically converted by the photoelectric conversion layer 20 drift to the silicon substrate 16 without being trapped by the interface level in the interface between the silicon substrate 16 and the photoelectric conversion layer 20, and are accumulated in the second semiconductor region 12. The semiconductor device 10 in the embodiment reads the charges accumulated in the second semiconductor region 12 as a signal.

The semiconductor device 10 in the embodiment can thus reduce noise included in the read signal.

The semiconductor device 10 applied to the imaging device 100 can also obtain the same effect.

In the semiconductor device 10 in the embodiment, the photoelectric conversion layer 20 and the silicon substrate 16 are stacked with the termination layer 22 interposed therebetween without providing an electrode layer (lower electrode) between the photoelectric conversion layer 20 and the silicon substrate 16.

With the semiconductor device 10 in the embodiment, the electrode layer (lower electrode) between the photoelectric conversion layer 20 and the silicon substrate 16 does not require to be finely processed so as to be fitted with the pixel region B. That is, the semiconductor device 10 in the embodiment does not require fine processing on the lower electrode for pixel separation. The semiconductor device 10 in the embodiment can readily form the pixel regions B by forming the second semiconductor regions 12 and the first semiconductor region 14 as a result of doping impurities into the silicon substrate 16.

The pixel regions B of the semiconductor device 10 in the embodiment can also be formed without performing fine processing on the lower electrode layer for pixel separation, while having the effect described above.

Second Embodiment

The following describes the imaging device 100 according to a second embodiment. The imaging device 100 in the second embodiment includes the semiconductor device 10 in the first embodiment provided with a color filter.

Figure 6:
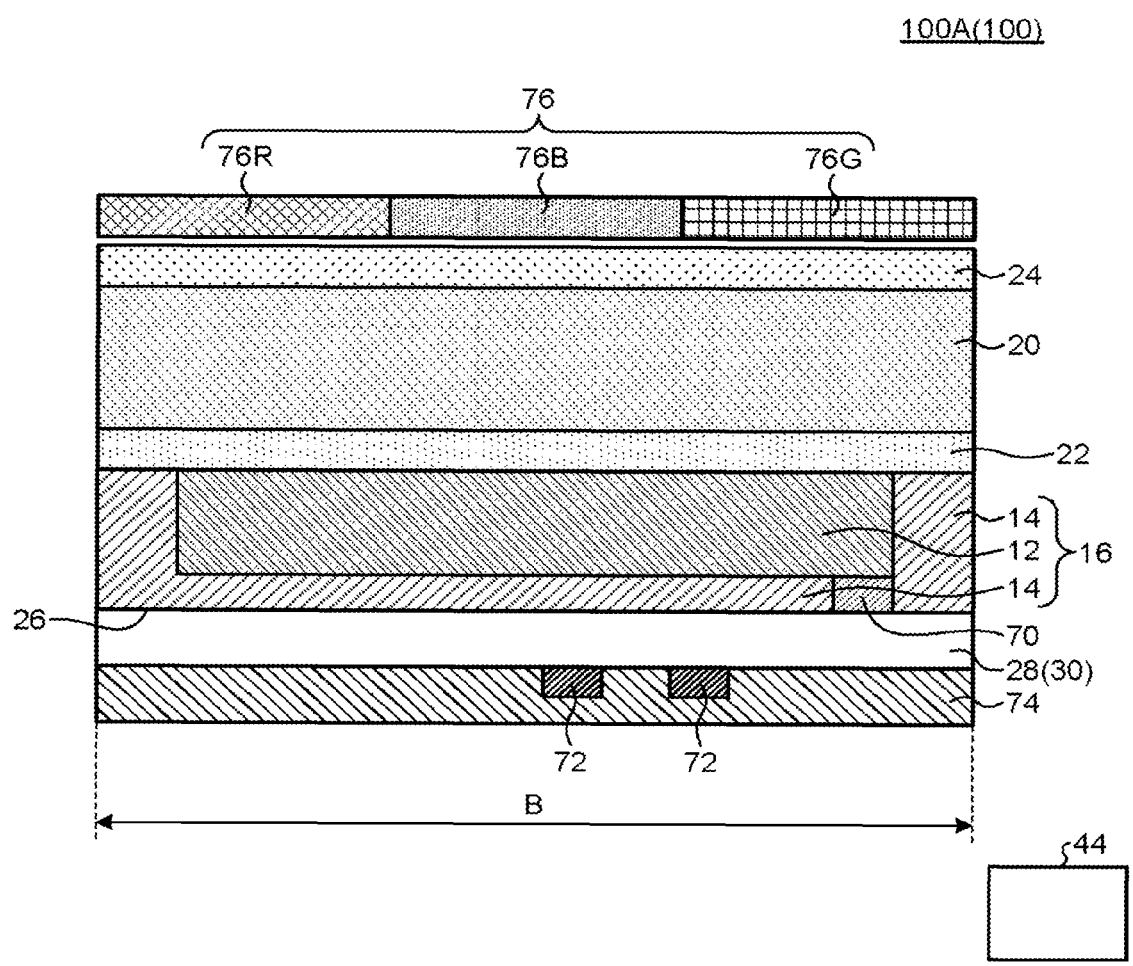
FIG. 6 is a schematic diagram illustrating an example of an imaging device.

FIG. 6 is a schematic diagram illustrating an example of an imaging device 100A in the second embodiment. The components having the same functions as the semiconductor device 10 in the first embodiment are labeled with the same numerals, and detailed descriptions thereof are thus omitted.

The imaging device 100A includes the reading circuit 28, the silicon substrate 16, the termination layer 22, the photoelectric conversion layer 20, the electrode layer 24, a color filter 76, and the voltage application unit 44.

The second semiconductor region 12 of the silicon substrate 16 is connected to the reading circuit 28 through a source terminal 70. Specifically, the second semiconductor region 12 is connected to the transfer transistor 30 of the reading circuit 28. On the surface opposite the silicon substrate 16 of the reading circuit 28, an insulation layer 74 is stacked in such a manner that the insulation layer 74 includes wiring layers 72 provided on the surface.

The color filter 76 is disposed at the light incident side of the electrode layer 24. The color filter 76 includes, for each pixel region B, a color filter 76R that absorbs light having a red wavelength range, a color filter 76B that absorbs light having a blue wavelength range, and a color filter 76G that absorbs light having a green wavelength range. The color filters 76R, 76B, and 76G are preferably arranged in a Bayer arrangement.

The thickness of the color filter 76 is not limited to any specific thickness. The thickness of the color filter 76 is 100 nm, for example.

As illustrated in FIG. 6, the imaging device 100A in the embodiment includes the color filter 76 above the electrode layer 24. The color filter 76 includes, for each region corresponding to each pixel region B, the color filter 76R that absorbs light having the red wavelength range, the color filter 76B that absorbs light having the blue wavelength range, and the color filter 76G that absorbs light having the green wavelength range.

Thus, the imaging device 100A in the embodiment can read, for each pixel region B, signals according to charges corresponding to respective light components R (light in the red wavelength range), G (light in the green wavelength range), and B (light in the blue wavelength range).

As described above, the imaging device 100A in the embodiment can achieve the same effect as the first embodiment because the imaging device 100A includes the termination layer 22 while the color filter 76 is provided.

Third Embodiment

The following describes the imaging device 100 according to a third embodiment. The imaging device 100 in the third embodiment includes the semiconductor device 10 in the first embodiment provided with a color filter different from that in the second embodiment.

Figure 7:
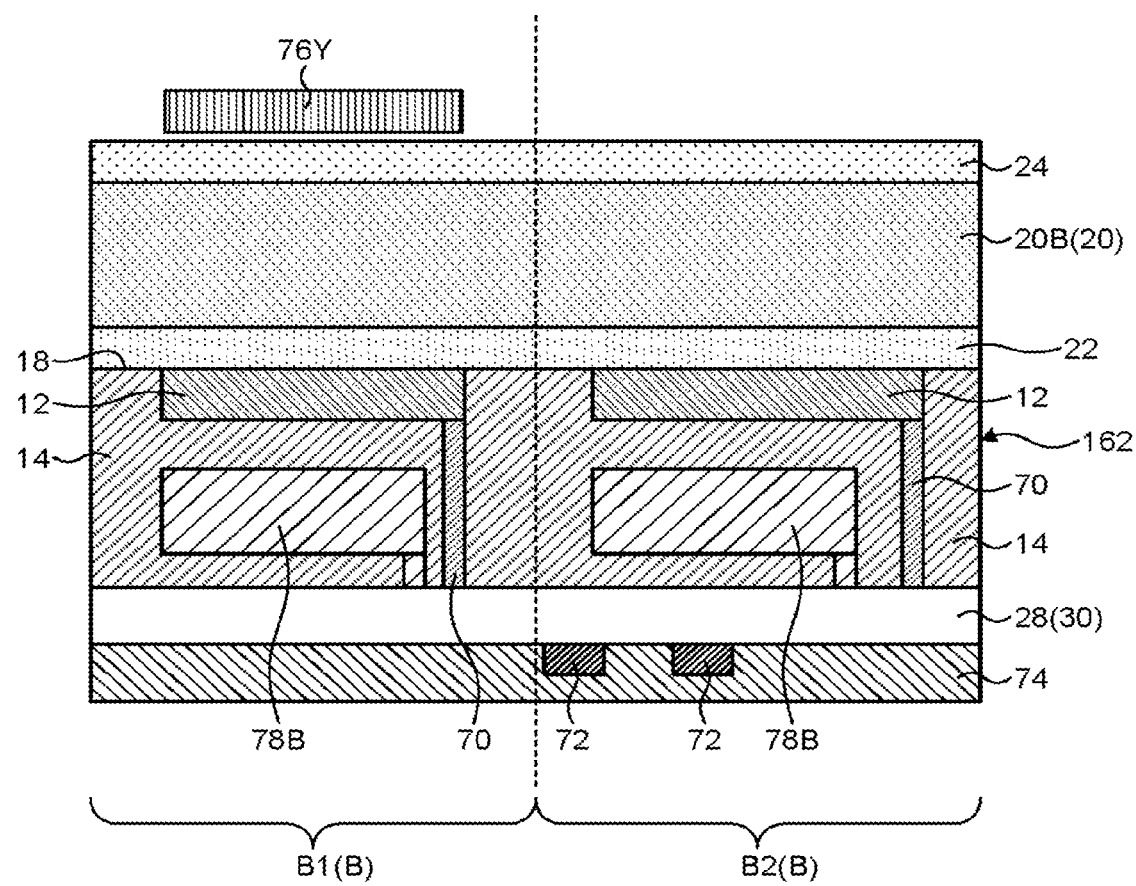
FIG. 7 is a schematic diagram illustrating an example of another imaging device.

FIG. 7 is a schematic diagram illustrating an example of an imaging device 100B in the third embodiment. The components having the same functions as the semiconductor device 10 in the first embodiment are labeled with the same numerals, and detailed descriptions thereof are thus omitted.

The imaging device 100B includes the reading circuit 28, a silicon substrate 162, the termination layer 22, a photoelectric conversion layer 20B, the electrode layer 24, a color filter 76Y, and the voltage application unit 44 (not illustrated in FIG. 7).

The photoelectric conversion layer 20B converts incident light into charges in the same manner as the photoelectric conversion layer 20. In the embodiment, the photoelectric conversion layer 20B performs photoelectric conversion on light in the blue wavelength range and on light in the green wavelength range. Light in the red wavelength range passes through the photoelectric conversion layer 20B.

The color filter 76Y is a yellow color filter that absorbs light in the blue wavelength range. The color filter 76Y is provided to the region corresponding to a pixel region B1 above the electrode layer 24. No color filter 76Y is provided to the region corresponding to a pixel region B2, which is the pixel region B adjacent to the pixel region B1.

The silicon substrate 162 includes the second semiconductor regions 12 and the first semiconductor regions 14 that are alternately and continuously arranged along the first surface 18 in the same manner as the silicon substrate 16. The second semiconductor region 12 is connected to the reading circuit 28 through the source terminal 70.

The size of each pixel region B is assumed to be 1 μm by 1 μm. The size of the second semiconductor region 12 in each pixel region B is assumed to be 750 nm by 750 nm, and the thickness of the second semiconductor region 12 is assumed to be 300 nm. The width of the first semiconductor region 14 in each pixel region B is assumed to be 125 nm. In this case, the second concentration $N_d$ of the second semiconductor region 12 is estimated as $1 \times 10^{16}$ cm$^{-3}$ to $1 \times 10^{17}$ cm$^{-3}$, and the number of saturation electrons is estimated as 10,000 to 20,000.

The silicon substrate 162 further includes photoelectric conversion sections 78B. Each of the photoelectric conversion sections 78B is disposed in the first semiconductor region 14 on the reading circuit 28 side of the second semiconductor region 12. The photoelectric conversion section 78B performs photoelectric conversion on light in the red wavelength region. The photoelectric conversion section 78B is a silicon photo diode (SiPD) that performs photoelectric conversion on light in the red wavelength region, for example. The photoelectric conversion sections 78B are connected to the reading circuit 28. On the surface opposite the silicon substrate 162 of the reading circuit 28, the insulation layer 74 is stacked in such a manner that the insulation layer 74 includes the wiring layers 72 provided on the surface.

The n-type region of the photoelectric conversion section 78B is completely depleted by a pn junction between the n-type region of the photoelectric conversion section 78B and the first semiconductor region 14, which is the p+ region surrounding the photoelectric conversion section 78B. The thickness of the silicon substrate 162 from the first surface 18 to the photoelectric conversion section 78B is 4 μm, for example. Substantially 100% of light in the red wavelength range entering the silicon substrate 162 having such a thickness is photoelectrically converted by the photoelectric conversion section 78B.

The second semiconductor region 12 is preferably formed in an extremely thin region below the surface of the silicon substrate 162 so as to have a thin thickness. Specifically, the thickness of the second semiconductor region 12 is preferably equal to or smaller than 300 nm. The second semiconductor region 12 having a thickness corresponding to an extremely thin region below the surface of the silicon substrate 162 can prevent part of light in the red wavelength range after passing through the photoelectric conversion layer 20B from being photoelectrically converted by the pn junction between the second semiconductor region 12 and the first semiconductor region 14 and causing a mixed color signal.

When light enters the imaging device 100B thus structured, the color filter 76Y absorbs light in the blue wavelength range from light entering the region corresponding to the pixel region B1 on the electrode layer 24. The region corresponding to the pixel region B1 in the photoelectric conversion layer 20B photoelectrically converts light in the green wavelength range into charges. The produced charges corresponding to light in the green wavelength range reach the second semiconductor region 12 in the pixel region B1 through the termination layer 22, and are accumulated in the second semiconductor region 12. The photoelectric conversion section 78B disposed on the reading circuit 28 side of the second semiconductor region 12 in the pixel region B1 accumulates light in the red wavelength range.

As a result, the signals according to the respective charges corresponding to light in the green wavelength range and light in the red wavelength range can be detected in the pixel region B1.

Light entering the region corresponding to the pixel region B2 on the electrode layer 24 reaches the photoelectric conversion layer 20B without passing through the color filter 76Y. The region corresponding to the pixel region B2 in the photoelectric conversion layer 20B photoelectrically converts light in the green wavelength range and light in the blue wavelength range into charges. The produced charges corresponding to light in the green wavelength range and light in the blue wavelength range reach the second semiconductor region 12 in the pixel region B2 through the termination layer 22, and are accumulated in the second semiconductor region 12. The second semiconductor region 12 in the pixel region B2 accumulates the sum of the signal according to the charges corresponding to light in the green wavelength range and the signal according to the charges corresponding to light in the blue wavelength range.

The photoelectric conversion section 78B disposed on the reading circuit 28 side of the second semiconductor region 12 in the pixel region B2 accumulates light in the red wavelength range.

The reading circuit 28, which reads the charges accumulated in the second semiconductor region 12 and the photoelectric conversion section 78B in the pixel region B2, calculates a signal according to the charges corresponding to light in the blue wavelength range by subtracting the signal corresponding to light in the green wavelength range obtained by the adjacent pixel region B1 from the signals (sum of the signals corresponding to light in the blue and green wavelength ranges) accumulated in the second semiconductor region 12 in the pixel region B2.

As a result, the signals according to the charges corresponding to light in the blue wavelength range, light in the green wavelength range, and light in the red wavelength range can be detected in the pixel region B2.

The imaging device 100B thus handles, as one pixel, the region including the pixel region B1 to which the color filter 76Y is provided and the pixel region B2 that is adjacent to the pixel region B1 and to which no color filter 76Y is provided. As a result, the imaging device 100B can detect, for each pixel, the signals according to the respective charges corresponding to light in the blue wavelength range, light in the green wavelength range, and light in the red wavelength range.

Instead of the yellow color filter 76Y that absorbs light in the blue wavelength range, the magenta color filter 76 that absorbs light in the green wavelength range may be disposed above the pixel region B1. Light in the green wavelength range is used as the principal component of a luminance signal. Light in the green wavelength range is thus preferably detectable by each of all of the pixel regions B. From this point of view, the color filter 76Y is preferably used for the color filter 76 disposed above the pixel region B1.

The longer the wavelength is, the further reduced an absorption coefficient of silicon is. Taking into consideration the mixing of signals corresponding to different colors in the second semiconductor region 12, the wavelength of light photoelectrically converted by the photoelectric conversion section 78B (the wavelength of light passing through the second semiconductor region 12) is preferably a longer wavelength, i.e., light in the red wavelength range is preferable.

As described above, the imaging device 100B in the embodiment can achieve the same effect as the first embodiment because the imaging device 100B includes the termination layer 22 while the color filter 76Y is provided.

Fourth Embodiment

The following describes the imaging device 100 according to a fourth embodiment. The imaging device 100 in the fourth embodiment includes the semiconductor device 10 in the first embodiment provided with a color filter different from that in the second embodiment.

Figure 8:
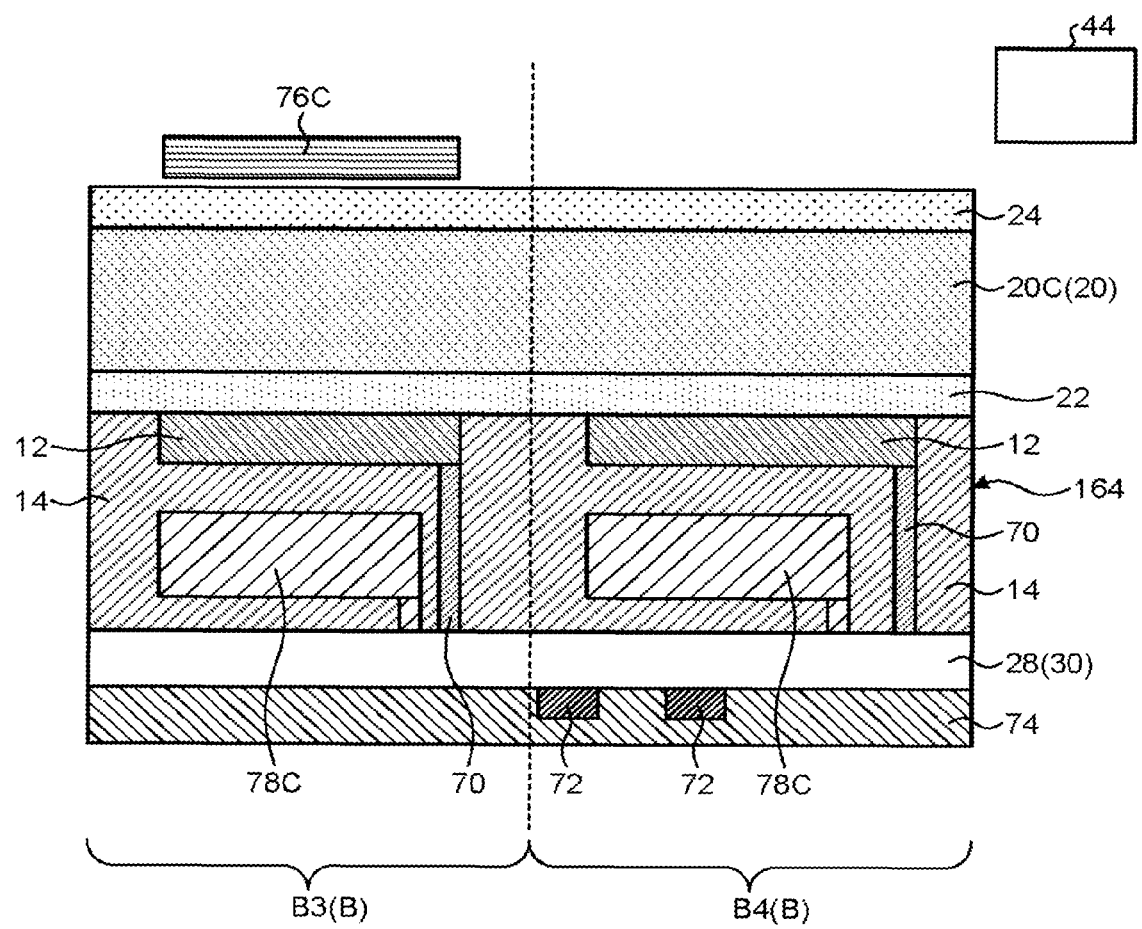
FIG. 8 is a schematic diagram illustrating an example of still another imaging device.

FIG. 8 is a schematic diagram illustrating an example of an imaging device 100C in the fourth embodiment. The components having the same functions as the semiconductor device 10 in the first embodiment are labeled with the same numerals, and detailed descriptions thereof are thus omitted.

The imaging device 100C includes the reading circuit 28, a silicon substrate 164, the termination layer 22, a photoelectric conversion layer 20C, the electrode layer 24, a color filter 76C, and the voltage application unit 44.

The photoelectric conversion layer 20C converts incident light into charges in the same manner as the photoelectric conversion layer 20. In the embodiment, the photoelectric conversion layer 20C performs photoelectric conversion on light in the red wavelength range and on light in the green wavelength range. Light in the blue wavelength range passes through the photoelectric conversion layer 20C.

The color filter 76C is a cyan color filter that absorbs light in the red wavelength range. The color filter 76C is provided to the region corresponding to a pixel region B3 above the electrode layer 24. No color filter 76C is provided to the region corresponding to a pixel region B4, which is the pixel region B adjacent to the pixel region B3.

The silicon substrate 164 includes the second semiconductor regions 12 and the first semiconductor regions 14 that are alternately and continuously arranged along the first surface 18 in the same manner as the silicon substrate 16.

The silicon substrate 164 further includes photoelectric conversion sections 78C. Each of the photoelectric conversion sections 78C is disposed in the first semiconductor region 14 on the reading circuit 28 side of the second semiconductor region 12. The photoelectric conversion section 78C performs photoelectric conversion on light in the blue wavelength region. The photoelectric conversion section 78C is a SiPD that performs photoelectric conversion on light in the blue wavelength region, for example. The photoelectric conversion sections 78C are connected to the reading circuit 28. On the surface opposite the silicon substrate 164 of the reading circuit 28, the insulation layer 74 is stacked in such a manner that the insulation layer 74 includes the wiring layers 72 provided on the surface.

The n-type region of the photoelectric conversion section 78C is completely depleted by a pn junction between the n-type region of the photoelectric conversion section 78C and the first semiconductor region 14, which is the p+ region surrounding the photoelectric conversion section 78C. The thickness of the silicon substrate 164 from the first surface 18 to the photoelectric conversion section 78C is 4 µm, for example. Substantially 100% of light in the blue wavelength range entering the silicon substrate 164 having such thickness is photoelectrically converted by the photoelectric conversion section 78C.

When light enters the imaging device 100C thus structured, the color filter 76C absorbs light in the red wavelength range from light entering the region corresponding to the pixel region B3 on the electrode layer 24. The region corresponding to the pixel region B3 in the photoelectric conversion layer 20C photoelectrically converts light in the green wavelength range into charges. The produced charges corresponding to light in the green wavelength range reach the second semiconductor region 12 in the pixel region B3 through the termination layer 22, and are accumulated in the second semiconductor region 12. The photoelectric conversion section 78C disposed on the reading circuit 28 side of the second semiconductor region 12 in the pixel region B3 accumulates light in the blue wavelength range.

As a result, the signals according to the respective charges corresponding to light in the green wavelength range and light in the blue wavelength range can be detected in the pixel region B3.

Light entering the region corresponding to the pixel region B4 on the electrode layer 24 reaches the photoelectric conversion layer 20C without passing through the color filter 76C. The region corresponding to the pixel region B4 in the photoelectric conversion layer 20C photoelectrically converts light in the green wavelength range and light in the red wavelength range into charges. The produced charges corresponding to light in the green wavelength range and light in the red wavelength range reach the second semiconductor region 12 in the pixel region B4 through the termination layer 22, and are accumulated in the second semiconductor region 12. The second semiconductor region 12 in the pixel region B4 accumulates the sum of the signal according to the charges corresponding to light in the green wavelength range and the signal according to the charges corresponding to light in the red wavelength range.

The photoelectric conversion section 78C disposed on the reading circuit 28 side of the second semiconductor region 12 in the pixel region B4 accumulates light in the blue wavelength range.

The reading circuit 28, which reads the respective charges accumulated in the second semiconductor region 12 and the photoelectric conversion section 78C in the pixel region B4, calculates a signal according to the charges corresponding to light in the red wavelength range by subtracting the signal corresponding to light in the green wavelength range obtained by the adjacent pixel region B3 from the signals (the sum of the signals corresponding to light in the red and green wavelength ranges) accumulated in the second semiconductor region 12 in the pixel region B3.

As a result, the signals according to the respective charges corresponding to light in the blue wavelength range, light in the green wavelength range, and light in the red wavelength range can be detected in the pixel region B4.

The imaging device 100C thus handles, as one pixel, the region including the pixel region B3 to which the color filter 76C is provided and the pixel region B4 that is adjacent to the pixel region B3 and to which no color filter 76C is provided. As a result, the imaging device 100C can detect, for each pixel, the signals according the respective charges corresponding to light in the blue wavelength range, light in the green wavelength range, and light in the red wavelength range.

As described above, the imaging device 100C in the embodiment can achieve the same effect as the first embodiment because the imaging device 100C includes the termination layer 22 while the color filter 76C is provided.

Fifth Embodiment

The following describes the imaging device 100 according to a fifth embodiment. The imaging device 100 in the fifth embodiment includes the semiconductor device 10 in the first embodiment provided with a color filter different from that in the second embodiment.

Figure 9:
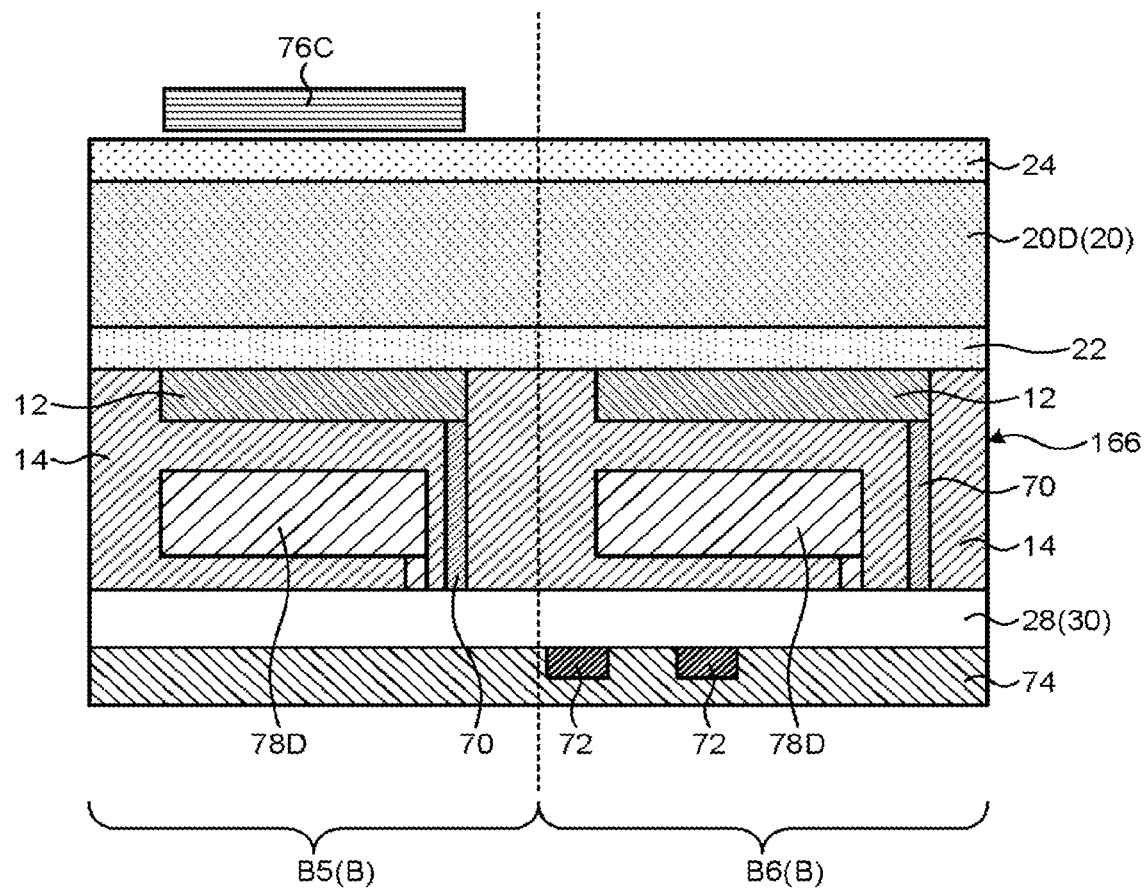
FIG. 9 is a schematic diagram illustrating an example of still another imaging device.

FIG. 9 is a schematic diagram illustrating an example of an imaging device 100D in the fifth embodiment. The components having the same functions as the semiconductor device 10 in the first embodiment are labeled with the same numerals, and detailed descriptions thereof are thus omitted.

The imaging device 100D includes the reading circuit 28, a silicon substrate 166, the termination layer 22, a photoelectric conversion layer 20D, the electrode layer 24, the color filter 76C, and the voltage application unit 44 (omitted to be illustrated in FIG. 9). The color filter 76C is the same as that in the fourth embodiment.

The photoelectric conversion layer 20D converts incident light into charges in the same manner as the photoelectric conversion layer 20. In the embodiment, the photoelectric conversion layer 20D performs photoelectric conversion on light in the red wavelength range and on light in the blue wavelength range. Light in the green wavelength range passes through the photoelectric conversion layer 20D.

The color filter 76C is the same as that in the fourth embodiment. The color filter 76C is provided to the region corresponding to a pixel region B5 above the electrode layer 24. No color filter 76C is provided to the region corresponding to a pixel region B6, which is the pixel region B adjacent to the pixel region B5.

The silicon substrate 166 includes the second semiconductor regions 12 and the first semiconductor regions 14 that are alternately and continuously arranged along the first surface 18 in the same manner as the silicon substrate 16.

The silicon substrate 166 further includes photoelectric conversion sections 78D. Each of the photoelectric conversion sections 78D is disposed in the first semiconductor region 14 on the reading circuit 28 side of the second semiconductor region 12. The photoelectric conversion section 78D performs photoelectric conversion on light in the green wavelength region. The photoelectric conversion section 78D is a SiPD that performs photoelectric conversion on light in the green wavelength region, for example. The photoelectric conversion sections 78D are connected to the reading circuit 28. On the surface opposite the silicon substrate 166 of the reading circuit 28, the insulation layer 74 is stacked in such a manner that the insulation layer 74 includes the wiring layers 72 provided on the surface.

The n-type region of the photoelectric conversion section 78D is completely depleted by a pn junction between the n-type region of the photoelectric conversion section 78D and the first semiconductor region 14, which is the p+ region surrounding the photoelectric conversion section 78D. The thickness of the silicon substrate 166 from the first surface 18 to the photoelectric conversion section 78D is 4 μm, for example. Substantially 100% of light in the green wavelength range entering the silicon substrate 166 having such thickness is photoelectrically converted by the photoelectric conversion section 78D.

When light enters the imaging device 100D thus structured, the color filter 76C absorbs light in the red wavelength range from light entering the region corresponding to the pixel region B5 on the electrode layer 24. The region corresponding to the pixel region B5 in the photoelectric conversion layer 20D photoelectrically converts light in the blue wavelength range into charges. The produced charges corresponding to light in the blue wavelength range reach the second semiconductor region 12 in the pixel region B5 through the termination layer 22, and are accumulated in the second semiconductor region 12. The photoelectric conversion section 78D disposed on the reading circuit 28 side of the second semiconductor region 12 in the pixel region B5 accumulates light in the green wavelength range.

As a result, the signals according the respective charges corresponding to light in the green wavelength range and light in the blue wavelength range can be detected in the pixel region B5.

Light entering the region corresponding to a pixel region B6 on the electrode layer 24 reaches the photoelectric conversion layer 20D without passing through the color filter 76C. The region corresponding to the pixel region B6 in the photoelectric conversion layer 20D photoelectrically converts light in the blue wavelength range and light in the red wavelength range into charges. The produced charges corresponding to light in the blue wavelength range and light in the red wavelength range reach the second semiconductor region 12 in the pixel region B6 through the termination layer 22, and are accumulated in the second semiconductor region 12. The second semiconductor region 12 in the pixel region B6 accumulates the sum of the signal according to the charges corresponding to light in the blue wavelength range and the signal according to the charges corresponding to light in the red wavelength range.

The photoelectric conversion section 78D disposed on the reading circuit 28 side of the second semiconductor region 12 in the pixel region B6 accumulates light in the green wavelength range.

The reading circuit 28, which reads the respective charges accumulated in the second semiconductor region 12 and the photoelectric conversion section 78D in the pixel region B6, calculates a signal according to the charges corresponding to light in the red wavelength range by subtracting the signal corresponding to light in the blue wavelength range obtained by the adjacent pixel region B5 from the signals (the sum of the signals corresponding to light in the blue and red wavelength ranges) accumulated in the second semiconductor region 12 in the pixel region B6.

As a result, the signals according to the respective charges corresponding to light in the blue wavelength range, light in the green wavelength range, and light in the red wavelength range can be detected in the pixel region B6.

The imaging device 100D thus handles, as one pixel, the region including the pixel region B5 to which the color filter 76C is provided and the pixel region B6 that is adjacent to the pixel region B5 and to which no color filter 76C is provided. As a result, the imaging device 100D can detect, for each pixel, the signals according the respective charges corresponding to light in the blue wavelength range, light in the green wavelength range, and light in the red wavelength range.

As described above, the imaging device 100D in the embodiment can achieve the same effect as the first embodiment because the imaging device 100D includes the termination layer 22 while the color filter 76C is provided.

Sixth Embodiment

The following describes the imaging device 100 according to a sixth embodiment. The imaging device 100 in the six embodiment includes the semiconductor device 10 in the first embodiment provided with a color variable layer and an optical system.

Figure 10:
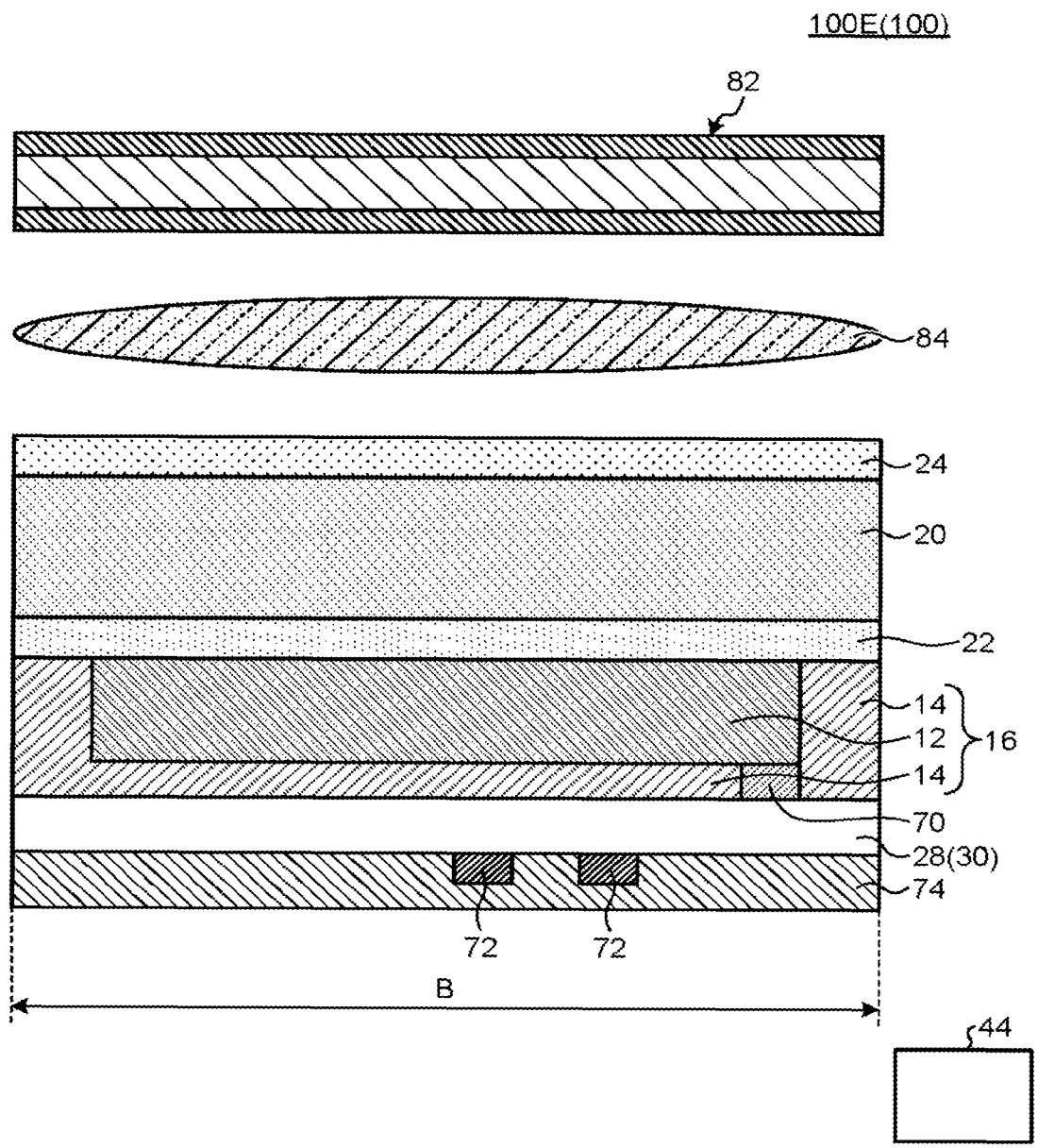
FIG. 10 is a schematic diagram illustrating an example of still another imaging device.

FIG. 10 is a schematic diagram illustrating an example of an imaging device 100E in the sixth embodiment. The components having the same functions as the semiconductor device 10 in the first embodiment are labeled with the same numerals, and detailed descriptions thereof are thus omitted.

The imaging device 100E includes the reading circuit 28, the silicon substrate 16, the termination layer 22, the photoelectric conversion layer 20, the electrode layer 24, an optical system 84, a color variable layer 82, and the voltage application unit 44.

The second semiconductor region 12 of the silicon substrate 16 is connected to the reading circuit 28 through the source terminal 70. Specifically, the second semiconductor region 12 is connected to the transfer transistor 30 of the reading circuit 28. On the surface opposite the silicon substrate 16 of the reading circuit 28, the insulation layer 74 is stacked in such a manner that the insulation layer 74 includes the wiring layers 72 provided on the surface.

The color variable layer 82 is disposed on the light incident side of the electrode layer 24. The color variable layer 82 can sequentially switch reflection wavelengths in the red wavelength region, the green wavelength region, and the blue wavelength region by an applied voltage. The color variable layer 82 uses an electrostrictive effect of blue phases. Specifically, the color variable layer 82 sandwiches a blue phase by a pair of electrode layers. The pair of electrode layers is connected to the voltage application unit 44. A spiral pitch of liquid crystal in the blue phase is changed by controlling an electric potential difference between the pair of electrode layers, thereby sequentially controlling the selective reflection wavelength in the red wavelength region, the green wavelength region, and the blue wavelength region by an applied voltage.

A change speed of the spiral pitch of liquid crystal is sufficiently higher than a frame rate (180 Hz) that is three times faster than that of typical moving images (frame rate of 60 Hz). The voltage application unit 44 thus drives the color variable layer 82 at 180 Hz in synchronization with the reading circuit 28. The voltage application unit 44 preferably reads the signal according to light in the red wavelength range, the signal according to light in the green wavelength range, and the signal according to light in the blue wavelength range in one frame period of 60 Hz so as to practically perform full color imaging in each 60-Hz interval.

Light in the wavelength range selectively reflected by the color variable layer 82 reaching each pixel region B of the electrode layer 24 through the optical system 84, is photoelectrically converted by the photoelectric conversion layer 20, and thereafter reaches the silicon substrate 16. The movements of electrons in the silicon substrate 16 and the operation of the reading circuit 28 are the same as those in the first embodiment.

As described above, the imaging device 100E in the embodiment can achieve the same effect as the first embodiment because the imaging device 100E includes the termination layer 22 while the color variable layer 82 is provided.

Seventh Embodiment

The following describes applications of the semiconductor device 10 in the embodiments described above. The semiconductor device 10 in the embodiments described above is applicable to a semiconductor chip, a mobile terminal provided with the imaging device 100, and a vehicle provided with the imaging device 100.

Figure 11:
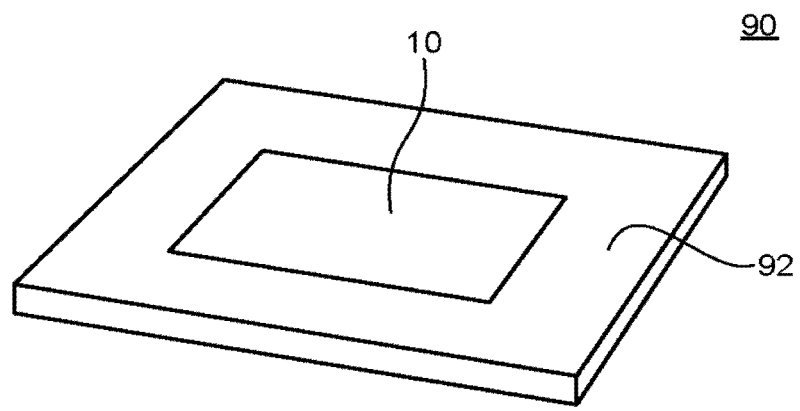
FIG. 11 is a schematic diagram illustrating an example of a semiconductor chip.

FIG. 11 is a schematic diagram illustrating an example of a semiconductor chip 90. The semiconductor chip 90 includes a substrate 92 on which the semiconductor device 10 is mounted. The semiconductor chip 90 includes the semiconductor device 10 in the embodiments described above.

The semiconductor chip 90 can thus obtain a signal from which noise is eliminated.

Figure 12:
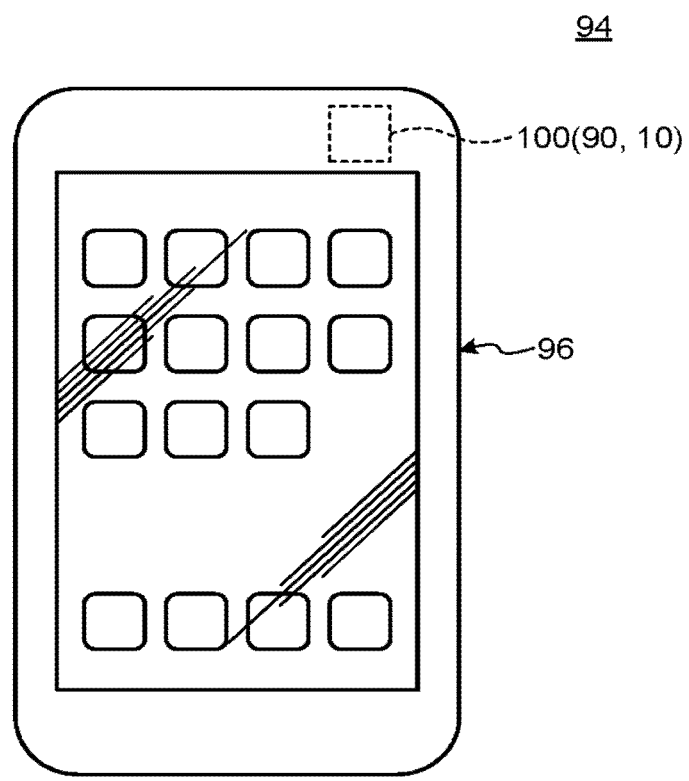
FIG. 12 is a schematic diagram illustrating an example of a mobile terminal.

FIG. 12 is a schematic diagram illustrating an example of a mobile terminal 94. The mobile terminal 94 includes a main body 96 on which the semiconductor chip 90 is mounted as the imaging device 100. The semiconductor chip 90 includes the semiconductor device 10 in the embodiments described above.

The mobile terminal 94 on which the semiconductor chip 90 is mounted can thus obtain a taken image from which noise is eliminated.

Figure 13:
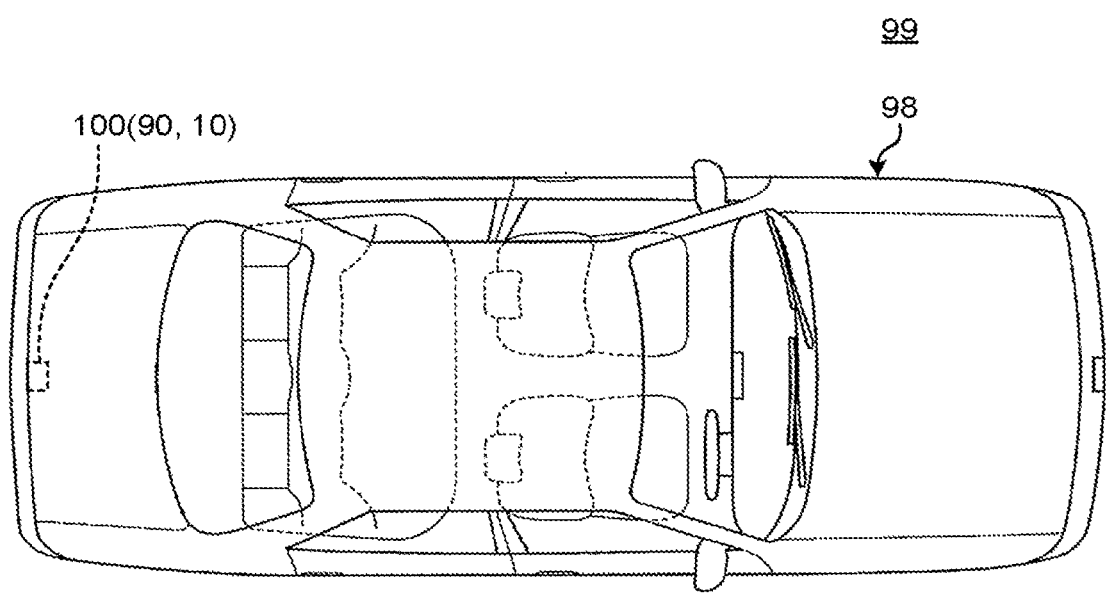
FIG. 13 is a schematic diagram illustrating an example of a vehicle.

FIG. 13 is a schematic diagram illustrating an example of a vehicle 99. The vehicle 99 includes a vehicle body 98 on which the semiconductor chip 90 provided with the semiconductor device 10 is mounted as the imaging device 100. The vehicle 99 on which the semiconductor chip 90 is mounted can thus obtain a taken image from which noise is eliminated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an electrode layer;
a silicon substrate in which first semiconductor regions and second semiconductor regions are alternately and continuously arranged along a first surface on a light incident side of the silicon substrate,
the first semiconductor regions being doped with impurities of a first concentration and having a conductivity of either one of a p-type and an n-type,
the second semiconductor regions being doped with impurities of a second concentration lower than the first concentration and having a conductivity of the other type;
a termination layer that is disposed between the electrode layer and the silicon substrate and terminates dangling bonds of the silicon substrate; and
a photoelectric conversion layer that is disposed between the termination layer and the electrode layer.

2. The device according to claim 1, wherein
the termination layer is a region where the dangling bonds on a surface of a silicon layer are terminated by hydrogen, the silicon layer being a layer in which the first and the second semiconductor regions are alternately and continuously arranged along the surface of the silicon layer.

3. The device according to claim 1, wherein the termination laser is a silicon dioxide film.

4. The device according to claim 1, wherein the termination layer has a thickness allowing charges to pass though the termination layer.

5. The device according to claim 1, further comprising a reading circuit that is provided on a second surface side of the silicon substrate, the second surface being opposite the first surface, wherein
the reading circuit includes:
a transfer transistor that is connected to the second semiconductor region and transfers charges accumulated in the second semiconductor region, the transfer transistor being a vertical transistor;
a third semiconductor region that is connected to the transfer transistor and. converts the charges transferred from the transfer transistor into a voltage; and
a wiring layer that outputs the converted voltage as a signal.

6. The device according to claim 1, wherein the termination laser is disposed in contact with both of the first surface of the silicon substrate and a third surface of the photoelectric conversion layer on a silicon substrate side.

7. The device according to claim 1, wherein the photoelectric conversion layer includes an organic material as a principal component.

8. The device according to claim 1, wherein
the second semiconductor regions function as charge accumulation regions that accumulate charges,
the first semiconductor regions function as pixel separation regions that separate pixel regions, and
the photoelectric conversion layer is a continuous film continuously provided along an arrangement direction of the charge accumulation regions.

9. The device according to claim 1, wherein a first density of the impurities of the first semiconductor region and a second density of the impurities of the second semiconductor region satisfy the following expression (1):

$$Na > Nd \times A_d / A_a \qquad (1)$$

where $N_a$ represents the first density, $N_d$ represents the second density, $A_a$ represents an area of the first semiconductor region in a pixel region, and $A_d$ represents an area of the second semiconductor region in the pixel region.

10. The device according to claim 1, further comprising a voltage applying unit configured to apply, to the electrode layer, a voltage equal to or larger than a voltage value allowing charges to pass through the termination layer by direct tunneling.

11. An imaging device comprising the semiconductor device according to claim 1.

* * * * *